Aug. 14, 1962 B. CARLAT ET AL 3,049,451
MULTIPLE ZONE SEMICONDUCTOR DEVICE AND
METHOD OF MAKING THE SAME
Filed Sept. 2, 1959

INVENTORS
BENEDICT CARLAT
ROBERT H. FIDLER JR.
BY
Eyre, Mann & Lucas
ATTORNEYS

United States Patent Office 3,049,451
Patented Aug. 14, 1962

3,049,451
MULTIPLE ZONE SEMICONDUCTOR DEVICE AND METHOD OF MAKING THE SAME

Benedict Carlat, Maplewood, and Robert H. Fidler, Jr., Newark, N.J., assignors to Tung-Sol Electric Inc., a corporation of Delaware Filed Sept. 2, 1959, Ser. No. 837,641
2 Claims. (Cl. 148—1.5)

Figure 1:
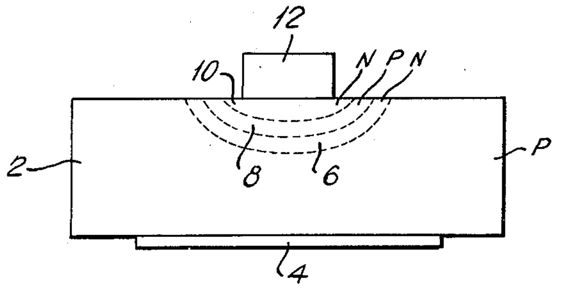

Our present invention relates to semi-conductor devices and more particularly to multiple zone semiconductor devices such as switching diodes, solid state thyratrons, transistors, and all other known multi-layer devices, and avalanche devices. Such devices have four zones arranged in succession, contiguous zones being of opposite conductivity type, and may have two or three terminals depending upon the desired functioning of the device. The invention comprises a novel method for producing semiconductor multiple zone devices which is simple to practice, results in a substantial saving in cost and which insures uniformity of product. The invention includes also the new multiple zone devices made by the new process.

Multiple zone semiconductor devices have heretofore been made by diffusion processes. For example, the process described in Shockley Patent 2,855,524 for making a four zone semiconductor switch involves successive heating of an n-type silicon wafer in vapors of arsenic, antimony oxide, and aluminum. During each heating step diffusion occurs into the original n-type silicon. The resulting five zone product is then alloyed at one face with aluminum to form a six zone structure and thereafter two of the original zones are etched off. As compared to this relatively complicated process of the prior art a four zone semiconductor is made in accordance with the invention in a single step and solely by alloying. We have found that when two conductivity type determining materials, such as indium and antimony, are combined in specific proportions and alloyed to an n- or p-type semiconductor crystal wafer multiple layers of alternate conductivity type freeze out during solidification of the alloyed wafer. Thus, by controlling the proportions of the multiple alloy, the temperature at which the alloying is carried out and the rate of cooling, a multiple zone semiconductor may be readily and simply manufactured without the use of diffusion techniques.

In the formation, for example, of a four zone germanium diode, an indium pellet containing 5% antimony is placed in close physical contact with a wafer of p-type germanium. This assembly is placed into a furnace and rapidly heated to a temperature of about 550° C., held at this temperature for five minutes or less and then cooled to room temperature. During this process a differential segregation of impurities occurs such that three layers of alternating polarity freeze out into the germanium with true junctions between the layers. The pellet may be used as one terminal of the resulting four zone diode and the other terminal may be provided by an ohmic contact to the original p-type wafer. It is believed that the separation into layers of the alloyed material is due to the differential rate of freezing of the indium, germanium and antimony of the multiple alloy formed during the process.

In an alternative embodiment of the invention a pellet of indium containing about ½ of 1% antimony is brought into physical contact with a wafer of n-type germanium and a second pellet of indium is brough into physical contact with the other side of the germanium wafer. When such an assembly is placed in a furnace and heated rapidly to a temperature in the neighborhood of 600° C. or less, and then cooled, n- and p-type layers are formed at the junction with the wafer of the pellet which contained the antimony and a p-type layer is formed at the junction with the wafer of the other pellet. By providing an ohmic contact to the wafer remote from the pellets, a three terminal device is formed suitable for use, for example, as a solid state thyratron.

In the accompanying drawing multiple zone semiconductor devices embodying the invention are diagrammatically represented.

Figure 2:
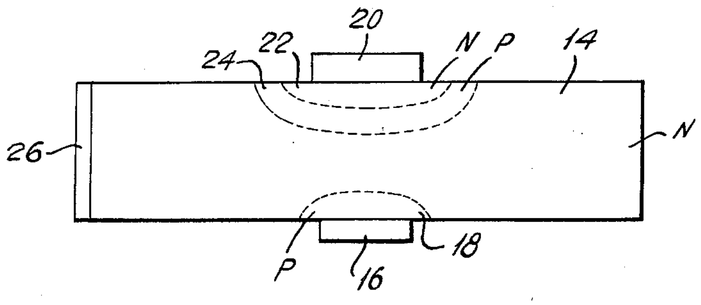

FIG. 1 is a diagram of a four zone diode produced by the multiple alloy process of the invention; and FIG. 2 is a similar diagram of a three terminal four zone semiconductor device of the invention.

The four zone semiconductor diode shown in FIG. 1 comprises a wafer 2 of p-type germanium, as indicated by the letter "p," an ohmic contact 4 on one side thereof, a layer 6 of n-type germanium indicated by the letter "n," a layer 8 of p-type germanium identified by the letter "p" and n-type zone 10 merging with an indium pellet 12 serving as the second terminal of the device. It will be appreciated that the layers 6, 8 and 10 have been shown in exaggerated scale for clarity. These layers, as described in connection with the example previously given, are formed as the result of alloying an indium pellet containing 5% antimony with p-type germanium. The layers 6, 8 and 10 freeze out during the cooling following heating of the wafer and pellet in a furnace. Photomicrographs of a transverse section of a device such as that of FIG. 1 show the thickness of the layers 6, 8 and 10 to be of the order of 1 or 2 microns. The device of FIG. 1 can be used as a switching diode.

The three terminal semiconductor four zone device of FIG. 2 comprises a wafer 14 of n-type germanium to which a pellet 16 of indium has been alloyed to form, on one side thereof, a p-type zone 18 and to the other side of which a pellet 20 originally containing indium and one half of one percent antimony has been alloyed to form the alternate layers 22 of n-type conductivity and 24 of p-type conductivity. An ohmic contact 26 is made to the wafer 14. As in the case of FIG. 1 the layers or zones 22 and 24 and the layer or zone 18 have been shown in exaggerated scale in the drawing. The dimensions of the zones are substantially the same as in the diode of FIG. 1. The three terminal device of FIG. 2 is essentially a solid state thyratron with the ohmic contact 26 serving as the gate or trigger grid for control of current between the pellets 16 and 20. In use, by analogy to vacuum tube nomenclature, the p-type zone 24 serves as a floating grid, the pellet 16 serves as a cathode and the pellet 20 serves as the anode.

The invention has now been described in connection with two embodiments thereof in each of which the semiconductor material has been described as germanium and in each of which antimony and indium have been employed for the materials to be alloyed with the germanium. Obviously the invention in its broader aspects is not limited to the specific materials given in the examples as the new method, involving the use of multiple alloys, may be practiced with other materials. For example, instead of antimony and indium, arsenic and aluminum could be employed. Silicon semiconductors, whether of p- or n-type, could be utilized as the starting wafer and various proportions other than those specifically mentioned could be used. Although the presently preferred temperature, when an indium-antimony pellet is alloyed with germanium, is in the neighborhood of 550° C., other temperatures, so long as they are within the range at which the materials will melt, are suitable. For an indium-antimony-germanium alloy temperatures in the range of 156° C. to 900° C. are possible. Although we have found that for such specific materials the peak temperature is preferably maintained for not more than 5 minutes, other proportions will require a longer or shorter period at peak temperature. In general, however, we believe that best results are obtained when the pellet and semiconductor are brought rapidly to a peak temperature and held at the peak temperature only long enough to insure melting of the contacting areas.

It will be apparent from the foregoing description that the invention radically simplifies the production of multiple zone semiconductor devices. No costly equipment and no difficult manipulative steps are required nor is it necessary to carry out the process in an inert atmosphere. It is believed that the reason why the alternate layers of p- and n-type conductivity are formed during the process is because of the differential rate of freezing of the elements of the multiple alloy formed between the semiconductor material and the two conductivity type materials. Irrespective, however, of the theoretical reason for the production of the alternate layers in the described process, such layers do form and can be readily detected and measured from photomicrographs. Such photomicrographs show abrupt junctions rather than graded junctions characteristic of junctions resulting from diffusion processes. That the process does not involve diffusion is also clear from the fact that the product we obtain appears to be of p-n-p-n formation rather than of p-n-n-p formation which would result if the layers were formed by diffusion.

The following is claimed:

1. The method of making a four zone semiconductor device which comprises placing a pellet of indium having about ½% by weight of antimony therein in physical contact with one surface of an n-type germanium wafer, placing a pellet of indium in physical contact with the opposite surface of the wafer, heating the assembly in a furnace to a temperature not over about 600° C. but sufficient to alloy the pellets and the parts of the wafer in contact therewith and then cooling the assembly to room temperature to prevent any substantial diffusion and to cause two zones of opposite conductivity type to resolidify adjacent the first pellet from the multiple alloy of the germanium, indium and antimony, the innermost zone being of p-type conductivity, and to cause a zone of p-type conductivity to resolidify adjacent the other pellet from the alloy of germanium and indium.

2. The four zone semiconductor device produced by the process of claim 1.

References Cited in the file of this patent

UNITED STATES PATENTS

| | | |
|---|---|---|
| 2,836,521 | Longini | May 27, 1958 |
| 2,840,497 | Longini | June 24, 1958 |